United States Patent
Chen

(10) Patent No.: US 10,873,003 B2
(45) Date of Patent: Dec. 22, 2020

(54) QUANTUM DOT COMPLEX AND ITS MANUFACTURING METHOD, INTERMEDIATE AND APPLICATIONS

(71) Applicant: BOE TECHNOLOGY GROUP CO., LTD., Beijing (CN)

(72) Inventor: Zhuo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 47 days.

(21) Appl. No.: 15/781,309

(22) PCT Filed: Oct. 27, 2017

(86) PCT No.: PCT/CN2017/108118
§ 371 (c)(1),
(2) Date: Jun. 4, 2018

(87) PCT Pub. No.: WO2018/171192
PCT Pub. Date: Sep. 27, 2018

(65) Prior Publication Data
US 2019/0267510 A1  Aug. 29, 2019

(30) Foreign Application Priority Data
Mar. 22, 2017 (CN) .......................... 2017 1 0175606

(51) Int. Cl.
*H01L 33/06* (2010.01)
*C08F 212/08* (2006.01)
(Continued)

(52) U.S. Cl.
CPC ............ *H01L 33/06* (2013.01); *C08F 212/08* (2013.01); *C08F 292/00* (2013.01); *C08G 61/08* (2013.01); *C09D 11/36* (2013.01); *C09D 11/50* (2013.01)

(58) Field of Classification Search
None
See application file for complete search history.

(56) References Cited

U.S. PATENT DOCUMENTS

2004/0262400 A1* 12/2004 Chang .................... B41M 3/144
235/468
2007/0202333 A1* 8/2007 O'Brien .................. C30B 7/005
428/402
(Continued)

FOREIGN PATENT DOCUMENTS

CN   102144279 A   8/2011
CN   102295745 A   12/2011
(Continued)

OTHER PUBLICATIONS

Shen (Biocompatible Polymer/Quantum Dots Hybrid Materials: current Status and Future Developments,Jfunct Bionnater. Dec. 2011; 2(4): 355-372) (Year: 2011).*
(Continued)

*Primary Examiner* — Ali Naraghi
(74) *Attorney, Agent, or Firm* — Dilworth & Barrese, LLP.; Michael J. Musella, Esq.

(57) ABSTRACT

A quantum dot complex and its manufacturing method, intermediate and applications are provided. The quantum dot complex includes a quantum dot and a plurality of polymeric chain ligands, wherein each of the polymeric chain ligands includes a coordination unit and at least one polymeric chain, and the coordination unit connects the quantum dot with the polymeric chain; and the polymeric chain has a molecular weight distribution of not more than about 1.3. The surface of the quantum dot in the quantum dot complex is bonded to a plurality of polymeric chain ligands by coordination, and the length of the polymeric chain is accurately controllable, so that the viscosity and surface tension of an ink containing the quantum dot complex can be (Continued)

quantum dot polymeric chain ligand effectively controlled. Moreover, additives can be avoided and a low boiling point solvent can also be used, thereby ensuring the purity of the quantum dots in the ink.

10 Claims, 4 Drawing Sheets

(51) Int. Cl.
    *C08F 292/00*     (2006.01)
    *C08G 61/08*     (2006.01)
    *C09D 11/36*     (2014.01)
    *C09D 11/50*     (2014.01)

(56) References Cited

U.S. PATENT DOCUMENTS

| | | | |
|---|---|---|---|
| 2011/0014473 A1* | 1/2011 | Ying | B82Y 5/00 428/407 |
| 2011/0105643 A1 | 5/2011 | Chun | |
| 2012/0282632 A1* | 11/2012 | Chiu | C09K 11/06 435/7.23 |
| 2014/0158950 A1* | 6/2014 | Helms | B82Y 40/00 252/512 |
| 2016/0161066 A1 | 6/2016 | Sung et al. | |
| 2017/0174984 A1* | 6/2017 | Lee | C08K 3/32 |

FOREIGN PATENT DOCUMENTS

| | | |
|---|---|---|
| CN | 102675565 A | 9/2012 |
| CN | 105018092 A | 11/2015 |
| CN | 105542746 A | 5/2016 |
| CN | 106009930 A | 10/2016 |
| CN | 106032468 A | 10/2016 |
| CN | 106188398 A | 12/2016 |
| CN | 106362162 A | 2/2017 |
| CN | 106905497 A | 6/2017 |
| EP | 2335272 A2 | 9/2008 |
| WO | 2010089545 A1 | 8/2010 |
| WO | 2015132673 A3 | 9/2015 |

OTHER PUBLICATIONS

International Search Report dated Jan. 31, 2018.
First Chinese Office Action dated Oct. 12, 2018.
Hongjin et al., "New Display Technology", Catalog, Aug. 31, 2014, 5 pgs, vol. 2, Bejing, China.
Xinghou et al., "Preperation of Polymer/Quantum Dots Nanocomposites" Jan. 18, 2015, pp. 4-9, China Academic Journal Electronic Publishing House.
Esteves et al., "Preparation of Nanocomposites by Reversibie Addition-Fragmentation Chain Transfer Polymerization from the Surface of Quantum Dots in Miniemuision", Oct. 15, 2009, pp. 5367-5377, vol. 47, Issue 20. Journal of Polymer Science: Part A: Polymer Chemistry.

* cited by examiner

QUANTUM DOT COMPLEX AND ITS MANUFACTURING METHOD, INTERMEDIATE AND APPLICATIONS

TECHNICAL FIELD

Embodiments of the present disclosure relate to the field of quantum dot materials. Specifically, the present disclosure relates to a quantum dot complex, and its manufacturing method, intermediate and applications. More specifically, the present disclosure relates to a quantum dot complex, its manufacturing method and intermediate, a quantum dot ink and a quantum dot light-emitting diode device.

BACKGROUND

Compared with conventional liquid crystal displays (LCD) and organic light-emitting diode displays (OLED), a quantum dot light emitting display (QLED) has special advantages such as a narrow light-emitting peak, an adjustable light-emitting color in accordance with its own size, a high light-emitting efficiency, and a high color gamut. The quantum dot light-emitting display has been considered as a good candidate for the next generation of new display technology.

Fabrication of a QLED requires that quantum dots be used to produce a quantum dot light-emitting layer. However, because the quantum dot material is a kind of inorganic nanoparticles, the structures in the QLED such as a quantum dot light-emitting layer have to be manufactured by an ink-jet printing method rather than a conventional evaporation method. At present, there are two approaches for formulating a quantum dot ink: one is to use an alkane having a long chain and a high viscosity, and the other is to add an additive such as a surfactant and a viscosity regulator to a low boiling point solvent.

Therefore, the improvement of the quantum dot ink for ink-jet printing is still needed.

SUMMARY

In a first aspect, the present disclosure provides a quantum dot complex for ink-jet printing.

According to at least one embodiment of the present disclosure, the quantum dot complex comprises a quantum dot and polymeric chain ligands, wherein each of the polymeric chain ligands comprises a coordination unit and at least one polymeric chain, and the coordination unit connects the quantum dot with the polymeric chain; and the polymeric chain has a molecular weight distribution (a ratio of a weight average molecular weight to a number average molecular weight) of not more than 1.3.

After a long period of study, the inventors of the present disclosure have found that the quantum dot complex in the embodiments of the present disclosure allows the surface of the quantum dot to be coordinated to a plurality of polymeric chain ligands, and the length of the polymeric chain is accurately controllable, so that the viscosity and surface tension of an ink containing the quantum dot complex can be effectively controlled. Moreover, additives can be avoided and a low boiling point solvent may also be used, thereby ensuring the purity of the quantum dots in the ink.

In addition, the quantum dot complex according to the above embodiments of the present disclosure may have one or more of the following additional technical features.

According to at least one embodiment of the present disclosure, the coordination unit may comprise at least one of a coordination element and a coordination group.

According to at least one embodiment of the present disclosure, the coordination element may comprise at least one of nitrogen, phosphorus, oxygen and sulfur; and the coordination group may comprise at least one of a carboxyl group, a hydroxyl group and an amine group.

According to at least one embodiment of the present disclosure, the polymeric chain may comprise at least one of PMMA, polystyrene, polycyclopentene, polycarbazole and polypurine.

According to at least one embodiment of the present disclosure, the polymeric chain may comprise an unsaturated group, and the unsaturated group may comprise an alkenyl group.

According to at least one embodiment of the present disclosure, the coordination unit may further comprise at least one branch chain, which is a carbon chain having 5 to 10 carbon atoms and is connected with the at least one of the coordination element and the coordination group.

In a second aspect, the present disclosure provides an intermediate for manufacturing the quantum dot complex.

According to at least one embodiment of the present disclosure, the intermediate may comprise a quantum dot and a coordination unit which is connected with the quantum dot and has an active end for initiating an active polymerization and forming the polymeric chain.

The inventors of the present disclosure have found that, the intermediate in the embodiments of the present disclosure not only allows coordination bonding of the quantum dot, but also has an active end for initiating an active polymerization and forming the polymeric chain in the polymeric chain ligand connected with the quantum dot.

In a third aspect, the present disclosure provides a method for manufacturing the quantum dot complex.

According to at least one embodiment of the present disclosure, the method may comprise: (1) providing a quantum dot; (2) bonding a polymeric chain ligand to the quantum dot by coordination, wherein the polymeric chain in the polymeric chain ligand is connected with the quantum dot via a coordination unit.

After a long period of study, the inventors of the present disclosure have found that by using the method according to the embodiments of the present disclosure, the quantum dot complex in which the length of the polymeric chain is accurately controllable can be obtained, and the viscosity and surface tension of the ink containing the quantum dot complex can be effectively controlled. Moreover, additives can be avoided and a low boiling point solvent can also be used, and the manufacturing method is simple to operate. As can be understood by those skilled in the art, the features and advantages described above for the quantum dot complex can also be applicable to the method for manufacturing the quantum dot complex, and thus are omitted herein.

In addition, according to the method in the above embodiments of the present disclosure, the additional technical features may be provided as follows.

According to at least one embodiment of the present disclosure, bonding the polymeric chain ligand to the quantum dot by coordination may be realized by the following steps: (2-1) producing the quantum dot connected to the coordination unit, wherein the coordination unit is bonded to the quantum dot by coordination; and (2-2) forming the polymeric chain by an active polymerization, wherein the polymeric chain is connected with the quantum dot via the coordination unit to obtain the polymeric chain ligand.

According to at least one embodiment of the present disclosure, the temperature of the active polymerization may be not more than 100° C., and the solvent of the active polymerization may comprise at least one of toluene and tetrahydrofuran.

According to at least one embodiment of the present disclosure, the polymeric chain may comprise an alkenyl group, and the method may further comprise: (3) adding a crosslinking agent after forming the polymeric chain to facilitate crosslinking reaction of alkenyls in the polymeric chain ligand.

In a fourth aspect, the present disclosure provides a method for manufacturing the above-mentioned quantum dot complex.

According to at least one embodiment of the present disclosure, the method may comprise:

(1) providing a first mother liquid, which comprises a first element, an organic ligand and a first solvent;

(2) providing a second mother liquid, which comprises a second element, the organic ligand and a second solvent;

(3) adding the first mother liquid to the second mother liquid in an inert atmosphere to form a mixture, stirring and heating at a temperature of about 200 to 350° C., and then cooling down the mixture after reacting for about 30 seconds to 1 hour;

(4) separating a precipitate from the cooled mixture by centrifugation and then drying the centrifuged precipitate to obtain the quantum dot connected with the coordination unit; and (5) mixing the quantum dot connected with the coordination unit with an initiator and a monomer for forming through an active polymerization the polymeric chain which is connected with the coordination unit to form the quantum dot complex;

wherein, the first element and the second element are used to form the quantum dot;

each of the first solvent and the second solvent independently comprises at least one of octadecene, trioctylphosphin and trioctyloxyphosphin;

the active polymerization reaction is performed at a temperature of about 90 to 100° C., and the active polymerization reaction comprises Atom Transfer Radical Polymerization (ATRP), Reversible Addition-Fragmentation Chain Transfer (RAFT), Nitroxide-Mediated Free Radical Polymerization (NMP), or Ring-Opening Metathesis Polymerization (ROMP).

After a long period of study, the inventors of the present disclosure have found that by using the method according to the embodiments of the present disclosure, the quantum dot complex in which the length of the polymeric chain is accurately controllable can be obtained, and the viscosity and surface tension of an ink containing the quantum dot complex can be effectively controlled. Moreover, additives can be avoided and a low boiling point solvent can also be used, and the manufacturing method is simple to operate. As can be understood by those skilled in the art, the features and advantages described above for the quantum dot complex can also be applicable to the method for manufacturing the quantum dot complex, and thus are omitted herein.

In a fifth aspect, the present disclosure provides a quantum dot ink.

According to at least one embodiment of the present disclosure, the quantum dot ink may comprise the above quantum dot complex and a low boiling point solvent.

After a long period of study, the inventors of the present disclosure have found that since the length of the polymeric chain is accurately controllable, the quantum dot ink in the embodiments of the present disclosure can meet the requirements of an inkjet printing high resolution QLED display screen on the viscosity and surface tension. Moreover, a low boiling point solvent can be used without additional additives, and the boiling point of the quantum dot ink can be not more than 100° C., thereby reducing the effect of subsequent high temperature treatment on the performance of the quantum dot and also ensuring the purity of the quantum dots in the ink. As can be understood by those skilled in the art, the features and advantages described above for the quantum dot complex can also be applicable to the quantum dot ink, and thus are omitted herein.

In a sixth aspect, the present disclosure provides a quantum dot light-emitting diode device.

According to at least one embodiment of the present disclosure, the quantum dot light-emitting diode device comprises a quantum dot light-emitting layer made from the quantum dot ink described above.

After a long period of study, the inventors of the present disclosure have found that the quantum dot light-emitting diode device in the embodiments of the present disclosure has an excellent performance since the quantum dot light-emitting function layer therein has a high quantum dot purity and an excellent light emitting efficiency. As can be understood by those skilled in the art, the features and advantages described above for the quantum dot complex and the quantum dot ink can also be applicable to the quantum dot light emitting diode device, and thus are omitted herein.

BRIEF DESCRIPTION OF THE DRAWINGS

The above and/or additional aspects and advantages of the present disclosure will become apparent and easy to be understood in connection with the description of the embodiments with reference to the following drawings, in which.

DETAILED DESCRIPTION

During research, the inventors have found that the quantum dot film manufactured by inkjet printing of the existing quantum dot ink generally has a problem of a poor light emitting performance. After an in-depth research, the inventors have found that the problem is mainly due to a high boiling point solvent used during preparing the quantum dot ink-jet printing ink or a surfactant and a viscosity regulator incorporated into the quantum dot ink-jet printing ink. If the solvent in the ink has a high boiling point, post-treatment at a high temperature (e.g. above 180° C.) is required for removing the solvent, and the high temperature post-treatment will impair the performance of the quantum dot. If a low boiling point solvent is used to manufacture the quantum dot inkjet ink, additives such as surfactants are usually added up to about 10% to 50%, then the surfactants and viscosity regulators will become "impurities" in the quantum dot film, so that the film-forming of the quantum dots is affected and the electroluminescent performance of the quantum dot film is impaired. In order to obtain a quantum dot ink with suitable viscosity and surface tension for inkjet printing, the current quantum dot inks generally employ a high boiling point solvent or additives such as a surfactant to adjust their above physical parameters.

In view of the above, one of the purposes of the present disclosure is to provide a quantum dot ink which is prepared by using a low boiling point solvent without additives such as a surfactant, and the viscosity and surface tension of which can be effectively controlled. The inventors of the present disclosure have found that the viscosity and surface tension of the quantum dot ink can be adjusted by accurately controlling the length of the quantum dot ligand, so that additives can be avoided and the purity of the quantum dots in the quantum dot ink is ensured. Moreover, because a high boiling point solvent is not required for controlling the viscosity and surface tension of the quantum dot ink, the low boiling point solvent can be used to prepare the quantum dot ink, thereby avoiding the influence of the subsequent high temperature treatment on the performance of the quantum dots. By means of active polymerization initiated on the quantum dot surface, a long chain ligand with a precisely controllable length can be introduced by accurately adjusting the length of the polymeric chain.

Figure 1:
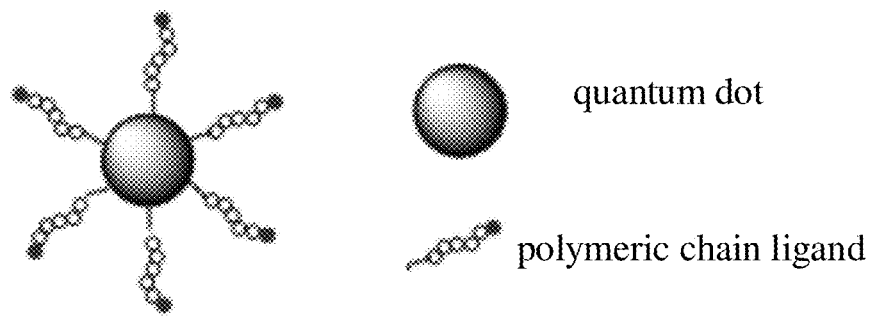
FIG. 1 is a schematic structural diagram of a quantum dot complex according to an embodiment of the present disclosure.
Figure 2:
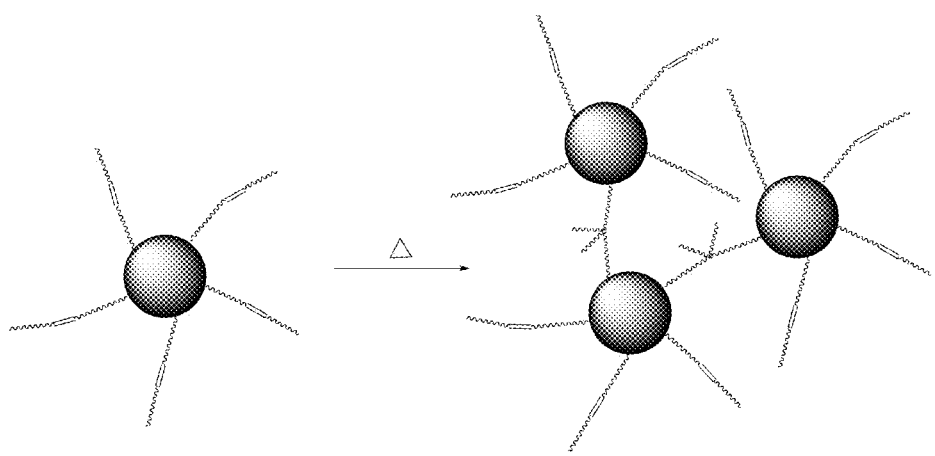
FIG. 2 is a process diagram which shows crosslinking quantum dot complexes to form a quantum dot film according to another embodiment of the present disclosure.
Figure 3:
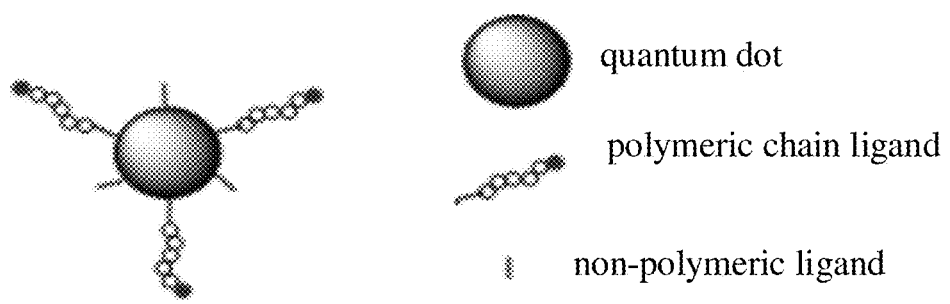
FIG. 3 is a schematic structural diagram of a quantum dot complex according to another embodiment of the present disclosure.

In one aspect of the present disclosure, a quantum dot complex for ink-jet printing is provided. With reference to FIGS. 1 to 3, the quantum dot complex provided by the present disclosure is described in detail.

According to at least one embodiment of the present disclosure, with reference to FIG. 1, the quantum dot complex comprises: a quantum dot; and a plurality of polymeric chain ligands, wherein each of the polymeric chain ligands comprises a coordination unit and at least one polymeric chain, and the coordination unit connects the quantum dot with the polymeric chain; and wherein the polymeric chain has a molecular weight distribution (a ratio of a weight average molecular weight to a number average molecular weight) not more than 1.3.

After a long period of research, the inventors of the present disclosure have found that an ideal quantum dot ink usually has a viscosity of about 10-12 cps at 60° C., a surface tension from about 28 dyn/cm to about 33 dyn/cm, and a density more than about 1 mg/mL. In addition, Removal of a solvent with a boiling point not more than 100° C. by heating would not impair the light emitting performance of the quantum dots because a high temperature treatment impairing the light emitting performance of the quantum dots is avoided. For ink-jet printing, the quantum dots further need to have a good dispersion and stability in the solvent.

After a long period of research, the inventors of the present disclosure have found that the viscosity and surface tension of the solution can be regulated by controlling the molecular weight and concentration of the polymer added to the solution. Thus, the viscosity and surface tension of the quantum dot ink can be adjusted by adding the polymer, so as to meet the requirements on the quantum dot ink for a high resolution QLED display screen by an ink-jet printing method. In the present disclosure, the polymeric chain having a precisely controllable degree of polymerization is connected to a coordination unit so as to realize a further connection with the quantum dot for obtaining the quantum dot complex. By controlling the concentration and molecular weight of the polymeric chain, the viscosity and surface tension of the quantum dot ink containing the quantum dot complex can be regulated. The quantum dot complex has simple structure and low cost, and it can be mixed with a low boiling point solvent to form the quantum dot ink which meets the requirements of ink-jet printing without adding other additives.

According to at least one embodiment of the present disclosure, there are no limitation on the type of the quantum dot, as long as the quantum dot can be used for subsequent coordination bonding and has a certain light emitting property and can be used to obtain the quantum dot complex according to the embodiment of the present disclosure. Those skilled in the art can choose the type of the quantum dot based on the actual requirements of inkjet printing or the manufactured QLED devices. In some embodiments of the present disclosure, the quantum dot may be of cadmium telluride (CdTe).

According to at least one embodiment of the present disclosure, there is no limitation on the size of the quantum dot, and those skilled in the art can choose the size of the quantum dot according to the actual requirements of ink-jet printing. In some embodiments of the present disclosure, the particle radius of the quantum dot is not more than 10 nm. Thus, the quantum dot ink containing the quantum dot complex formed by the quantum dot with the above particle radius has an excellent stability, and the performance of the quantum dot function layer printed is excellent.

In some embodiments of the present disclosure, the particle radius of the quantum dot is from about 2 nm to about 10 nm. Thus, the quantum dot ink containing the quantum dot complex formed by using the quantum dot with the above particle radius has an excellent stability and thus an excellent dispersion, and the performance of the quantum dot function layer printed is excellent.

According to at least one embodiment of the present disclosure, the coordination unit includes a coordination element and/or a coordination group. It should be noted that the "coordination unit" in the present application has a coordination element or group capable of coordination bonding to the surface of the quantum dot, and the coordination unit also has an active end for subsequent active polymerization to form a polymeric chain. Thus, for a quantum dot complex using a coordination element or a coordination group, the coordination unit can coordinate to the surface of the quantum dot of an inorganic nanoparticle via the structure of its coordination element or coordination group such as a lone pair of electrons. As such, an effective connection between the quantum dot and the polymeric chain ligand can be ensured and the dispersion and stability of the quantum dot in the quantum dot ink is improved.

According to at least one embodiment of the present disclosure, the coordination element comprises at least one of nitrogen, phosphorus, oxygen and sulfur. Thus, the lone pair of electrons of the above coordination element in the polymeric chain ligand can form a strong coordination bond directly with the surface of the quantum dots. In some specific embodiments of the present disclosure, the coordination element may be a phosphorus atom, and its lone pair of electrons can coordinate to the surface of the quantum dot, and the polyvalent phosphorus atom can further chemically bond to an active end that can initiate an active polymerization, such as a chlorine atom. For example, chlorine atom may act as an active end in a subsequent active polymerization reaction, and the carbon chain is extended by the active polymerization to obtain the polymeric chain according to the embodiment of the present disclosure.

According to at least one embodiment of the present disclosure, the coordination group comprises at least one of a carboxyl group, a hydroxyl group, and an amine group. Thus, the lone pair of electrons of the above coordination group in the polymeric chain ligand form a weak coordination bond to the surface of the quantum dots, and the carboxyl group or hydroxyl group is connected to the polymeric chain via a chemical bond, so that the stability and dispersion of the quantum dots can be enhanced by the polymeric chain due to the above coordination group. In some embodiments of the present disclosure, the coordination group coordinated to a quantum dot may be a carboxylic acid. Thus, in a case that the carboxylic group is used as the coordination group, both the oxygen atom and hydroxyl group in the carboxylic acid group can coordinate to the surface of the quantum dots, so that the chemical stability of the linkage between the polymeric chain ligand and the quantum dot is enhanced, and the stability and dispersion of the quantum dot is enhanced by the polymeric chain due to the coordination group. In some specific embodiments of the present disclosure, the coordination group may be a carboxyl group, wherein the lone pair of electrons of the oxygen atom in the hydroxyl group and carbonyl group can coordinate to the surface of the quantum dots, and the other end of the hydroxyl group can further chemically bond to the carbon chain containing an active end that can initiate an active polymerization reaction, such as a carbon-carbon unsaturated double bond. For example, the carbon-carbon unsaturated double bond may be used as an active end in the subsequent active polymerization reaction to further extend the carbon chain, so that the polymeric chain according to the embodiment of the present disclosure can be obtained.

In some specific embodiments, the coordination unit may further comprise at least one branch chain, which may be a carbon chain with a carbon number ranging from about 5 to about 10, and the branch chain is connected to a coordination element and/or a coordination group. In this way, the steric hindrance of other short carbon chains directly connected with the coordination unit can be utilized to prevent agglomeration of the quantum dots in the process of forming a polymeric chain by the active polymerization. For example, when the coordination element is a phosphorus atom, the branch chain can be covalently connected with the phosphorus atom.

According to at least one embodiment of the present disclosure, the polymeric chain may be obtained by the active polymerization. After a long period of research, the inventors of the present disclosure have found that the synthetic method of the active polymerization can accurately control the length of the polymeric chain. By adjusting the concentration of the polymerization monomer and the initiator, the chain length and monodispersion of the polymer can be controlled accurately, and the viscosity and surface tension of the polymer solution can be effectively controlled.

According to at least one embodiment of the present disclosure, there is no limitation on the type of the polymeric chain, and those skilled in the art can select any conventional polymeric chain as long as the molecular chain length and polydispersion of the polymeric chain can be controlled. In some embodiments of the present disclosure, the type of the polymeric chain may include at least one of PMMA, PS, polycyclopentene, polycarbazole, and polypurine. Thus, by using the polymeric chain of the above types, the properties of the ink containing the quantum dot complex, such as viscosity, surface tension, dispersion and stability, can meet the requirements of forming a high resolution QLED display screen by an ink-jet printing method. In addition, the above polymers have good film-forming property and can form an excellent film layer with the quantum dots after printing.

According to at least one embodiment of the present disclosure, there is no limitation on the chain length of the polymeric chain, as long as the polymeric chain with the chain length can allow the viscosity and surface tension of the ink containing the quantum dot complex to meet the requirements of printing, and can allow the dispersion and stability of the quantum dots in the ink to be maintained. Those skilled in the art can adjust the chain length according to the actual situation. In some embodiments of the present disclosure, the number-average molecular weight of the polymeric chain may be from about 300 to about 2000. Thus, the active polymerized polymeric chain in the range of molecular weight mentioned above can better regulate the viscosity and surface tension of the ink containing the quantum dot complex, so that the ink can further meet the requirements of quantum dot printing. Moreover, the dispersion and stability of the quantum dots in the ink containing a low boiling point solvent without additives can be maintained. In some specific embodiments of the present disclosure, the number-average molecular weight of the polymeric chain can be from about 500 to about 800.

According to at least one embodiment of the present disclosure, the polymeric chain may further contain an unsaturated group. Thus, after printing the ink containing the quantum dot complex and during subsequent drying to remove solvents, the unsaturated group in the polymeric chain can further undergo a crosslinking reaction to increase the matrix strength of the film (referring to FIG. 2), so that a quantum dot functional layer with better stability can be obtained. Alternatively, the unsaturated group in the polymeric chain may also be used to further introduce other functional groups by chemical modification, so as to further improve the properties of the quantum dot complex. In some embodiments of the present disclosure, the polymeric chain may contain an alkenyl group. For the polymeric chain containing an alkenyl group (for example, the polymeric chain is polycyclopentene), the alkenyl group can undergo a crosslinking reaction during subsequent drying to remove solvents to form a three-dimensional network structure, which further increases the matrix strength of the film and results in a quantum dot functional layer with better stability.

According to at least one embodiment of the present disclosure, the quantum dot complex may further comprise a plurality of non-polymeric ligands (referring to FIG. 3). The non-polymeric ligands comprise a second coordination unit and at least one non-polymeric branch chain, and the second coordination unit connects the quantum dot with the non-polymeric branch chain. In this way, by adjusting the concentration of the polymeric ligands and the non-polymeric ligands, the ratio of short chain to long chain coordinated to the surface of the quantum dots can be controlled, so that the viscosity and surface tension of the ink containing the quantum dot complex can be further regulated. In some embodiments of the present disclosure, the second coordination unit may be the same as the coordination unit, and the non-polymeric branch chain may be a carbon chain with a carbon number ranging from about 5 to about 10. Thus, by adjusting the concentration of polymeric chain ligands and non-polymeric ligands, the ratio of short chain to long chain coordinated to the surface of the quantum dots can be effectively controlled, so that the quantum dot ink manufactured by the quantum dot complex can be more suitable for ink jet printing. The above non-polymeric ligands may be bonded to the surface of the quantum dots, synchronous with the previously described polymeric chain ligands.

To sum up, according to at least one embodiment of the present disclosure, a quantum dot complex is provided, in which the surface of the quantum dot coordinates to a plurality of polymeric chain ligands and the length of the polymeric chain is accurately controllable so that the viscosity and surface tension of an ink containing the quantum dot complex can be effectively regulated. Moreover, other additives are avoided, and a low boiling point solvent can also be used to ensure the purity of the quantum dots in the ink.

In another aspect of the present disclosure, an intermediate for manufacturing the above-mentioned quantum dot complex is provided.

According to at least one embodiment of the present disclosure, the intermediate comprises a quantum dot and a coordination unit, in which the coordination unit is connected with the quantum dot, and the coordination unit has an active end for initiating an active polymerization to form a polymeric chain. As understood by those skilled in the art understood, the intermediate is used to prepare the quantum dot complex, and the active end of the coordination unit can be used to initiate an active polymerization for forming the polymeric chain in the polymeric chain ligand of the quantum dot complex.

According to at least one embodiment of the present disclosure, the intermediate is used to manufacture the previously described quantum dot complex, and thus the quantum dot and the coordination unit of the intermediate have the same properties and advantages as the corresponding structures of the quantum dot complex described above. In general, the intermediate allows coordination bonding of the quantum dot, and also has an active end that can initiate the active polymerization for forming the polymeric chain in the polymer chain ligand described above.

Figure 4:
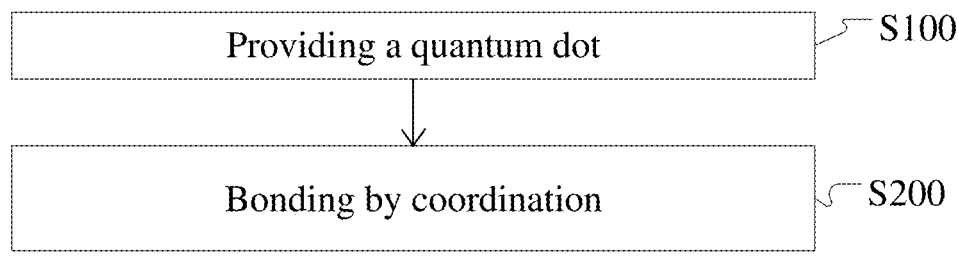
FIG. 4 is a flow diagram of a method for manufacturing a quantum dot complex according to another embodiment of the present disclosure.
Figure 5:
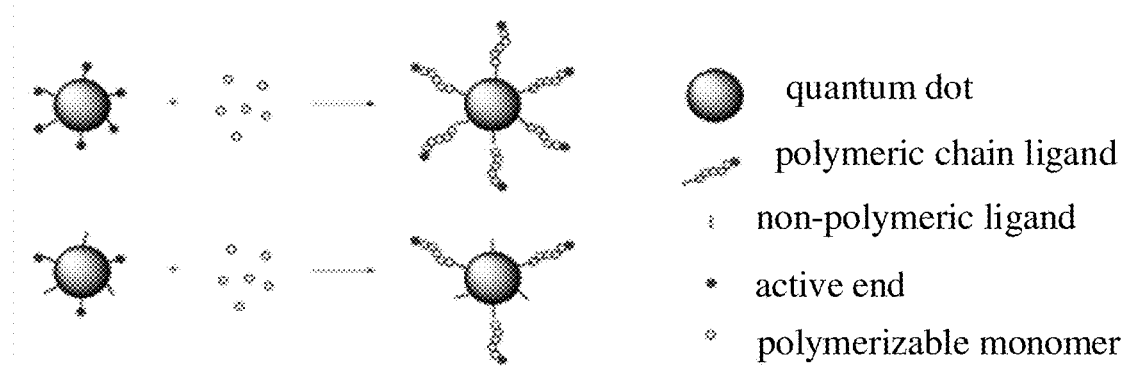
FIG. 5 is a principle diagram of an active polymerization method of a polymeric chain according to another embodiment of the present disclosure.

In another aspect of the present disclosure, a method for manufacturing the above-mentioned quantum dot complex is provided. Referring to FIGS. 4 to 5, a method for manufacturing the quantum dot complex is described in detail. According to at least one embodiment of the present disclosure, the manufacturing method (referring to FIG. 4) includes:

S100: providing a quantum dot.

In this step, a quantum dot material for subsequent coordination bonding can be obtained. According to at least one embodiment of the present disclosure, there is no limitation on the method of providing a quantum dot, and the quantum dot can be purchased directly or manufactured by using any known method in the field, as long as the quantum dot can be used for subsequent coordination bonding and inkjet printing. The quantum dot can be chosen by the skilled artisan according to the requirements of the ink jet printing.

S200: coordination bonding.

In this step, the quantum dot from the previous step is bonded to the polymeric chain ligand by coordination and, specifically, the coordination unit of the polymeric chain ligand is directly coordinated to the surface of the quantum dot.

According to at least one embodiment of the present disclosure, there is no limitation on the specific method for obtaining the polymeric chain ligand, and the skilled artisan may select any familiar method for obtaining the polymeric chain ligand according to the embodiment of the present disclosure. For example, the polymeric chain with an accurately controllable length can be formed on the coordination unit by active polymerization. The polymeric chain may have a molecular weight distribution of not more than about 1.3, and those skilled in the art can make a choose according to the actual situation.

According to at least one embodiment of the present disclosure, there is no limitation on the specific method for coordinating the polymeric chain ligand to the quantum dot, as long as the polymeric chain ligand can be bonded to the quantum dots by coordination. Those skilled in the art can select the method according to the actual situation.

In some embodiments of the present disclosure, the coordination bonding of the polymeric chain ligand to the quantum dot may be accomplished by:

S210: manufacturing a quantum dot connected with a coordination unit.

According to at least one embodiment of the present disclosure, the quantum dot to which the coordination unit is bonded by coordination is manufactured in this step (referring to FIG. 5). Moreover, the coordination unit bonded to the quantum dot has an active initiation site for forming a polymeric chain. Thus, it is convenient in the subsequent steps to use the active initiation site for forming the polymeric chain connected with the coordination unit. For example, according to some specific embodiments of the present disclosure, a liquid phase reaction may be used to manufacture a quantum dot, and at the same time, the coordination unit containing a coordination element or a coordination group may be connected to the surface of the quantum dot by coordination bonding. In this way, the coordination unit with the active initiation site, rather than existing organic ligands for protecting quantum dots, may be added to the reaction solution and then the similar steps and conditions for manufacturing the quantum dots can be used to directly obtain the quantum dots coordinated to the coordination unit, so that a simplified operation, a reduced production cost and an improved production efficiency can be achieved.

S220: active polymerization.

According to at least one embodiment of the present disclosure, in this step, a polymeric chain connected with a coordination unit is manufactured by active polymerization in order to obtain a quantum dot complex. Specifically, active polymerization is initiated at the active end of the coordination unit, so that the polymeric chain with a precisely controlled polymerization degree can be obtained by controlling the concentration of the polymerization monomer.

According to at least one embodiment of the present disclosure, an active polymerization initiated on a coordination unit enables the length of the obtained polymeric chain to be precisely controlled. In some embodiments of the present disclosure, the specific type of the active polymerization may include at least one of Atom Transfer Radical Polymerization (ATRP), Reversible Addition-Fragmentation Chain Transfer (RAFT), Nitroxide-Mediated Free Radical Polymerization (NMP), and Ring-Opening Metathesis Polymerization (ROMP). The above method of active polymerization allows the distribution of the molecular weight of the polymeric chain not more than about 1.3, so that the concentration and surface tension of the ink composed of the quantum dot complex can be accurately controlled.

For example, according to some specific embodiments of the present disclosure, Reversible Addition-Fragmentation Chain Transfer (RAFT) may be used. The active end of the coordination unit (e.g., Cl atom) is used to connect with

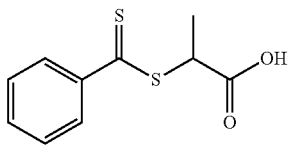

by for example a substitution reaction, and the active polymerization of a monomer containing an unsaturated bond such as styrene by a Reversible Addition-Fragmentation Chain Transfer reaction can form a PS polymeric chain with a precisely controllable chain length.

For example, according to some specific embodiments of the present disclosure, Ring-Opening Metathesis Polymerization (ROMP) may be used. The active end of the coordination unit such as a carbon-carbon unsaturated double bond is used, and the active polymerization of a monomer with a ring structure containing an unsaturated bond such as cyclopentene in the presence of the second generation Grubbs catalyst by a Ring-Opening Metathesis Polymerization reaction can form a polycyclopentene polymeric chain with an accurately controllable chain length. According to at least one embodiment of the present disclosure, the temperature of the active polymerization is not more than about 100° C., and the solvent of the active polymerization may comprise at least one of toluene and tetrahydrofuran. As such, the conditions of the above active polymerization can ensure that the polymeric chain grows accurately at the coordination unit on the surface of the quantum dot, and can also avoid the undesired effects of the high reaction temperature or the poor solvent on the performance of the quantum dots and ensure the performance of the printed quantum dot functional layer.

To sum up, according to at least one embodiment of the present disclosure, a manufacturing method is provided for producing a quantum dot complex whose polymeric chain has a precisely controllable length. The quantum dot complex allows the viscosity and surface tension of the quantum dot ink to be effectively controlled and avoids using additives. The manufacturing method has the advantages of simple operation, low cost, short production cycle and high production efficiency, and it is beneficial to the large-scale application of the quantum dot complex. As mentioned above, because the quantum dot complex manufactured by this method allows the viscosity and surface tension of the quantum dot ink based on the quantum dot complex to be effectively controlled, the quantum dot ink can meet the requirements of ink jet printing simply by using a low boiling point solvent. As understood by those skilled in the art, the quantum dot complex manufactured by this method has the same features and advantages as the quantum dot complex described above.

In another aspect of the present disclosure, a method for manufacturing the above-mentioned quantum dot complex is provided.

According to at least one embodiment of the present disclosure, the method comprises:

(1) Providing a First Mother Liquid.

The first mother liquid comprises a first element, an organic ligand and a first solvent. According to some specific embodiments of the present disclosure, the first element is used to form the quantum dot. For example, when the quantum dot is CdTe, the first element can be Te. The organic ligand is a coordination unit with a group for initiating an active polymerization, for example compound 1 in FIG. 6 and oleic acid. The first solvent should be a good solvent for the liquid phase reaction of the first element, such as octadecene, trioctylphosphine and trioctylphosphine oxide. There is no limitation on the proportion of the first element, the organic ligand and the first solvent in the first mother liquid, and the skilled artisan in this field can adjust the proportion according to the composition of the quantum dot complex intended to be manufactured.

(2) Providing a Second Mother Liquid;

The second mother liquid comprises a second element, the organic ligand and a second solvent. According to some specific embodiments of the present disclosure, the second element is also used to form the quantum dot. For example, when the quantum dot is CdTe and the first element is Te, the second element can be Cd. The organic ligand is a coordination unit with a group for initiating an active polymerization, for example compound 1 in FIG. 6 and oleic acid. The second solvent should be a good solvent for the liquid phase reaction of the second element, such as octadecene, trioctylphosphine and trioctylphosphine oxide. There is no limitation on the proportion of the second element, the organic ligand and the second solvent in the second mother liquid, and the skilled artisan in this field can adjust the proportion according to the composition of the quantum dot complex intended to be manufactured.

(3) Mixing the First Mother Liquid with the Second Mother Liquid.

In this step, the first mother liquid is added to the second mother liquid in an inert atmosphere, then stirred and heated at a temperature of about 200 to 350° C. After reacting for about 30 seconds to 1 hour, the mixture is cooled down. Thus, under the above reaction conditions, the quantum dot crystals whose surface is coordinated to a coordination unit with a group for initiating an active polymerization can grow to a desired size. In some embodiments of the present disclosure, the heating temperature may be about 290° C., and the mixture is cooled down after reacting about 15 minutes. As such, the quantum dot crystals with better size and performance can be obtained under the above reaction conditions.

(4) Centrifugation.

In this step, the cooled mixture is subjected to centrifugation, and the separated precipitate is dried to obtain the quantum dot connected with the coordination unit. According to some specific embodiments of the present disclosure, chloroform is added to the mixture, and a supernatant is collected by centrifugation, then methanol is added to the supernatant to precipitate the quantum dot, and the precipitated quantum dot is collected by centrifugation, which is a quantum dot whose surface coordinates to a coordination unit with a group for initiating an active polymerization.

(5) Active Polymerization.

In this step, the quantum dot connected with the coordination unit is mixed with an initiator and a monomer for preparing the polymeric chain by an active polymerization, and the quantum dot complex is obtained by connecting the polymeric chain with the coordination unit. According to at least one embodiment of the present disclosure, the temperature of the active polymerization reaction is about 90 to 100° C., and the active polymerization reaction comprises ATRP, RAFT, NMP or ROMP. By using the above-mentioned active polymerization reaction, the molecular weight error of the polymeric chain in the polymeric chain ligand is not more than about 50, so that the concentration and surface tension of the ink composed of the quantum dot complex can be more accurately and effectively regulated.

To sum up, according to at least one embodiment of the present disclosure, a manufacturing method is provided for producing a quantum dot complex whose polymeric chain has a precisely controllable length. The quantum dot complex allows the viscosity and surface tension of the quantum dot ink to be effectively controlled and avoids using additives. A low boiling point solvent can also be used, and the manufacturing method is simple to operate. As understood by those skilled in the art, the quantum dot complex manufactured by this method has the same features and advantages as the quantum dot complex described above.

In another aspect of the present disclosure, a quantum dot ink is provided. According to at least one embodiment of the present disclosure, the quantum dot ink includes the quantum dot complex described above and a low boiling point solvent. It should be noted that the low boiling point solvent herein is a solvent with a boiling point below 100° C.

After a long period of study, the inventors of the present disclosure have found that the length of the quantum dot ligand can be accurately controlled by an active polymerization so as to adjust the viscosity and surface tension of the quantum dot ink, thereby avoiding additives and ensuring the purity of the quantum dots in the quantum dot ink. Moreover, the solvent with a low boiling point can be used to avoid the effect of the subsequent high temperature treatment (over 180° C.) on the performance of quantum dots.

According to at least one embodiment of the present disclosure, there is no limitation on a specific type of the low boiling point solvent, as long as the boiling point of the solvent is below 100° C. and the quantum dot complex can be well dissolved. The skilled artisan in this field can choose the type according to the specific properties of the quantum dot complex. In some embodiments of the present disclosure, the low boiling point solvent includes at least one solvent selected from toluene, xylene, n-hexane, n-heptane and n-octane. Thus, the quantum dot complex can be effectively dissolved by using the low boiling point solvent, and the boiling point of the quantum dot ink can be below 100° C.

According to at least one embodiment of the present disclosure, the quantum dot complex is less than about 5 wt % based on the weight of the quantum dot ink. As such, the quantum dot ink formed from the quantum dot complex and the low boiling point solvent not only meets the printing requirements for manufacturing a quantum dot layer, but also makes the boiling point of the quantum dot ink lower than 100° C. Furthermore, the effect of subsequent high temperature drying to remove the solvent on the performance of the quantum dot can be avoided. In some embodiments of the present disclosure, the quantum dot complex is from about 1 wt % to about 2 wt % based on the weight of the quantum dot ink.

To sum up, according to at least one embodiment of the present disclosure, a quantum dot ink is provided. In the quantum dot ink, the length of the polymeric chain in the quantum dot complex is accurately controllable so that the quantum dot ink can meet the requirements of an inkjet printing high resolution QLED display screen on the viscosity and surface tension. Moreover, a low boiling point solvent can be used without additives, and the boiling point of the quantum dot ink can be lower than 100° C., so as to reduce the effect of subsequent high temperature treatment on the performance of the quantum dot and ensure the purity of the quantum dots in the ink. As understood by those skilled in the art, the features and advantages described above for the quantum dot complex can also be applicable to the quantum dot ink, and thus are omitted herein.

In another aspect of the present disclosure, a quantum dot light-emitting diode device is provided.

According to at least one embodiment of the present disclosure, the quantum dot light-emitting diode device includes a quantum dot light emitting layer, and the quantum dot light emitting layer is manufactured from the quantum dot ink described above. As understood by those skilled in the art, the quantum dot light-emitting diode device may include, in addition to the quantum dot light-emitting layer, other components or structures such as a substrate, an upper electrode layer, a lower electrode layer, an electron injection layer, an electron transport layer, a hole transport layer, a hole injection layer, a light output coupling layer, etc. The artisan in this field can design a quantum dot light-emitting diode device according to the practical requirements of the quantum dot light-emitting diode device.

According to at least one embodiment of the present disclosure, there is no limitation on the type of the quantum dot light emitting diode device, as long as the quantum dot light emitting diode device emits light by means of the quantum dot light emitting layer. The device can be any known quantum dot light-emitting diode device in the field. The skilled in the art can design a quantum dot light-emitting diode device according to the practical requirements of the quantum dot light-emitting diode device.

To sum up, according to at least one embodiment of the present disclosure, a quantum dot light-emitting diode device is provided. In the quantum dot light-emitting diode device, the quantum dot light-emitting function layer has a high quantum dot purity and an excellent light emitting efficiency. Thus, the performance of the quantum dot light-emitting diode device is excellent. As understood by the skilled in the art, the features and advantages described above for the quantum dot complex and the quantum dot ink can also be applicable to the quantum dot light emitting diode device, and thus are omitted herein.

Some examples of the present disclosure are described in detail below. Those skilled in the art can understand that these examples are intended to explain the present disclosure and should not be regarded as a limitation on the present disclosure. Unless otherwise specified, for techniques or conditions not specifically described in the examples below, the skilled artisan may choose those conventional techniques or conditions in the field, or follow the product specifications. All the reagents or instruments whose manufacturers are not described are conventional products available in the market.

EXAMPLE 1

Preparing an Intermediate

In this example, an intermediate for manufacturing a quantum dot complex is prepared, wherein CdTe quantum dot is used as the quantum dot.

Figure 6:
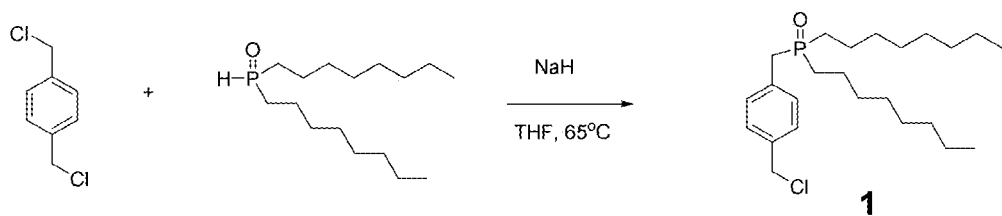
FIG. 6 is a schematic diagram of a chemical reaction in step (1) according to Example 1 of the present disclosure.

The specific steps are as follows:

(1) The chemical reaction equation is shown in FIG. 6. Compound 1 having a coordination unit which can initiate an active polymerization is synthesized from

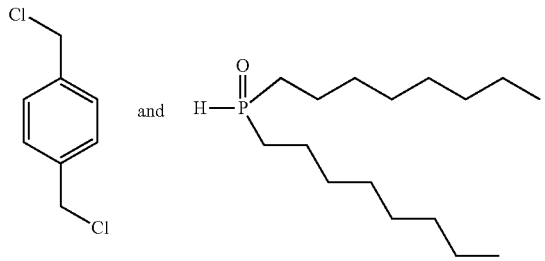 [SMILES: ClCc1ccc(CCl)cc1 ; CCCCCCCC[PH](=O)CCCCCCCC]

in a THF solvent containing NaH at a temperature of 65° C. The peak positions of the $^1$H NMR spectra of compound 1 are $^1$H NMR (CDCl$_3$) δ(ppm): 7.20-7.25, m, 4H; 4.65, s, 2H; 2.94, s, 2H; 1.65-1.70, m, 4H; 1.25-1.30, m, 20H; 0.88, t, 6H respectively.

(2) 0.01 g Te powder and 0.054 g compound 1 are weighed, and dissolved in 2.5 mL octadecene in a nitrogen atmosphere to obtain a reserve liquid of Te.

(3) 0.015 g CdO and 0.12 g stearic acid are weighed and put into a three-necked flask, and 5 mL octadecene is added in a nitrogen atmosphere. The mixture is heated to more than 160° C., and stirred until CDO is completely dissolved. After cooling the reaction system to room temperature, 1.5 g of hexadecylamine (HAD) and 0.1 g of compound 1 from the step (1) are added. After stirring and heating to 290° C. in a nitrogen atmosphere, the reserve liquid of Te from the step (2) is rapidly added, and then the reaction system is kept for a period of time at 290° C. After the quantum dot crystal grows to a desired size, the reaction system is rapidly cooled.

(4) Chloroform is added to the reaction mixture, and the upper liquid is collected by centrifugation, then methanol is added to precipitate the quantum dot. The precipitate in the lower layer obtained by centrifugation is intermediate 2 whose surface coordinates to a coordination unit having a group for initiating an active polymerization. After drying, the quantum dots can be dissolved and stored in toluene to prepare a 10 mg/mL solution.

EXAMPLE 2

Manufacturing a Quantum Dot Complex

In this example, a quantum dot complex is manufactured by a method of RAFT active polymerization using intermediate 2 from Example 1, and a quantum dot ink can be formed. The type of polymeric chain herein is PS.

The specific steps are as follows.

Figure 7:
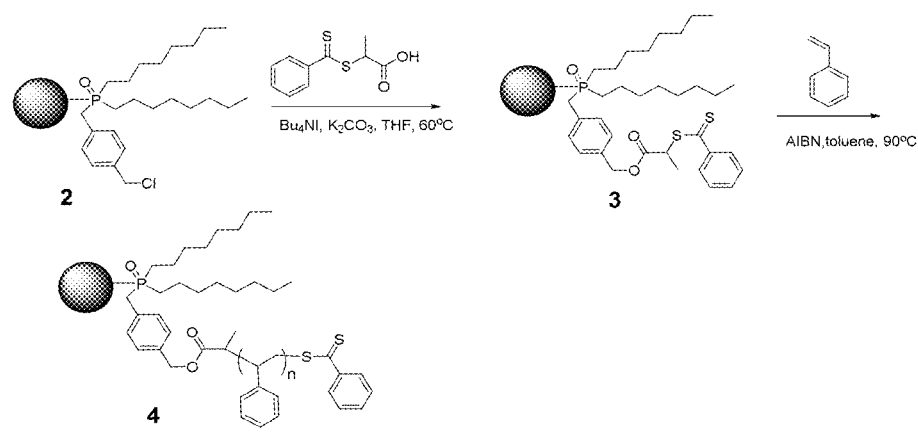
FIG. 7 is a schematic diagram of a chemical reaction in step (1) according to example 2 of the present disclosure.

(1) The steps of the RAFT active polymerization are shown in FIG. 7. By using a toluene solution of intermediate 2, intermediate 2 reacts with

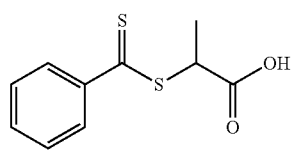

to form compound 3 in a THF solvent containing Bu$_4$NI and K$_2$CO$_3$ at a temperature of 60° C. Compound 3 further reacts with styrene by RAFT active polymerization in a toluene solvent containing AIBN at a temperature of 90° C. to form quantum dot complex 4 with a long chain polymeric ligand. The molecular weight of the polymeric chain is 500 (obtained by GPC).

(2) Quantum dot complex 4 is dissolved in toluene, and the concentration of the quantum dot complex is 1%. The viscosity of the quantum dot ink is measured to be 17 cps and the surface tension of the quantum dot ink is 31.3 dyn/cm (20° C.).

EXAMPLE 3

Manufacturing a Quantum Dot Complex

In this example, a quantum dot complex is manufactured by a method of NMP active polymerization using intermediate 2 from example 1, and a quantum dot ink can be formed.

The specific reaction steps are as follows.

Figure 8:
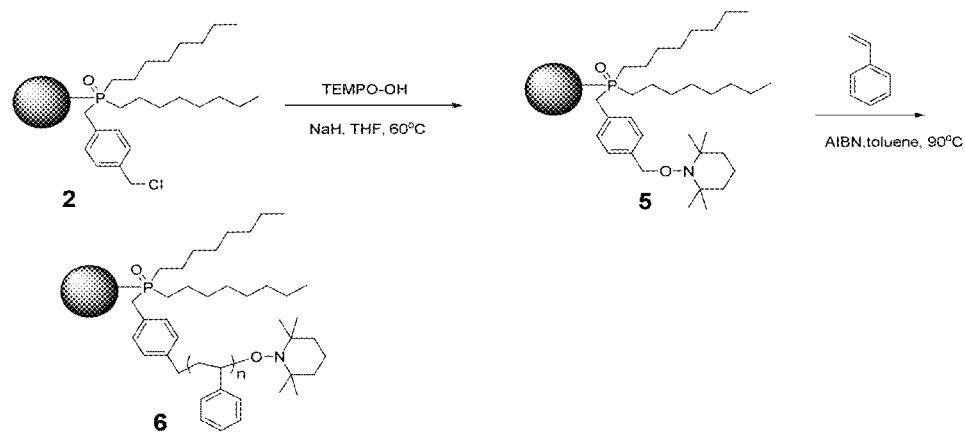
FIG. 8 is a schematic diagram of a chemical reaction in step (1) according to Example 3 of the present disclosure.

(1) The steps of the NMP active polymerization are shown in FIG. 8. By using a toluene solution of intermediate 2, intermediate 2 reacts with TENPO-OH to form compound 5 in a THF solvent containing NaH at a temperature of 60° C. Compound 5 further reacts with styrene by NMP active polymerization in a toluene solvent containing AIBN at a temperature of 90° C. to form quantum dot complex 6 with a long chain polymeric ligand. The molecular weight of the polymeric chain is 500 (obtained by GPC).

(2) Quantum dot complex 6 is dissolved in toluene, and the concentration of the quantum dot complex is 1%. The viscosity of the quantum dot ink is measured to be 17 cps and the surface tension of the quantum dot ink is 31.3 dyn/cm (20° C.).

EXAMPLE 4

Preparing an Intermediate

In this example, an intermediate is prepared according to similar method and conditions as Example 1.

The difference is that in this example:

(2) 0.01 g Te powder, 0.018 g compound 1, and 0.051 g trioctylphosphine oxide are weighed (the molar ratio of compound 1 to the trioctylphosphine oxide is 1:3);

(3) 1.5 g hexadecylamine (HAD), 0.03 g compound 1, and 0.085 g trioctylphosphine oxide are added (the molar ratio of compound 1 to the trioctylphosphine oxide is 1:3);

(4) quantum dot 7 whose surface coordinates to a coordination unit having a group for initiating active polymerization is obtained. After drying, intermediate 7 can be dissolved and stored in toluene, and a 10 mg/mL solution is prepared.

EXAMPLE 5

Manufacturing a Quantum Dot Complex

In this example, a quantum dot complex is manufactured by a RAFT active polymerization using intermediate 7 from Example 4, and a quantum dot ink can be formed.

The specific steps are as follows.

Figure 9:
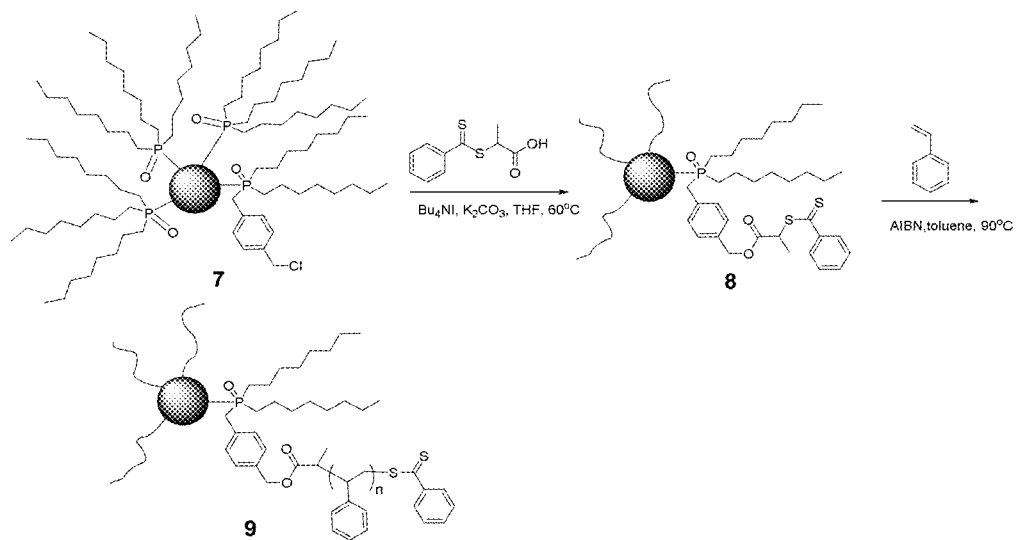
FIG. 9 is a schematic diagram of a chemical reaction in step (1) according to Example 5 of the present disclosure.

(1) The steps of the RAFT active polymerization are shown in FIG. 9. By using a toluene solution of intermediate 7, intermediate 7 reacts with

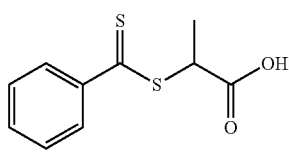

to form compound 8 in a THF solvent containing Bu$_4$NI and K$_2$CO$_3$, at a temperature of 60° C. (wherein three non-polymeric ligands of compound 8 in FIG. 9 have the same structure as that of quantum dot 7, but the three non-polymeric ligands of compound 8 are simplified in FIG. 9). Compound 8 further reacts with styrene by RAFT active polymerization in a toluene solvent containing AIBN at a temperature of 90° C., to form quantum dot complex 9 with a long polymeric chain ligand. The molecular weight of the polymeric chain is 500 (detected by GPC after an elution using pyridine).

(2) Quantum dot complex 9 is dissolved in toluene, and the concentration of quantum dot complex 9 is 1 wt %. The viscosity of the quantum dot ink is measured to be 11 cps and the surface tension of the quantum dot ink is 28.3 dyn/cm (20° C.).

EXAMPLE 6

Manufacturing an Intermediate

In this example, an intermediate is prepared according to similar method and conditions as Example 1.

The difference is that in this example:

(1) This step of Example 1 is absent;

(2) 0.01 g Te powder and 0.054 g oleic acid are weighed;

(3) This step of Example 1 is followed except that "adding 1.5 g hexadecylamine (HAD) and 0.1 g compound 1 of Example 1" is replaced with "1.5 g hexadecylamine (HAD) and 0.1 g oleic acid";

(4) This step is similar to that in Example 1, and a 10 mg/mL solution of intermediate 10 in toluene is obtained.

EXAMPLE 7

Manufacturing a Quantum Dot Complex

In the example, a quantum dot complex is manufactured by a ROMP active polymerization using intermediate 10 from Example 6, and a quantum dot ink can be formed.

Figure 10:
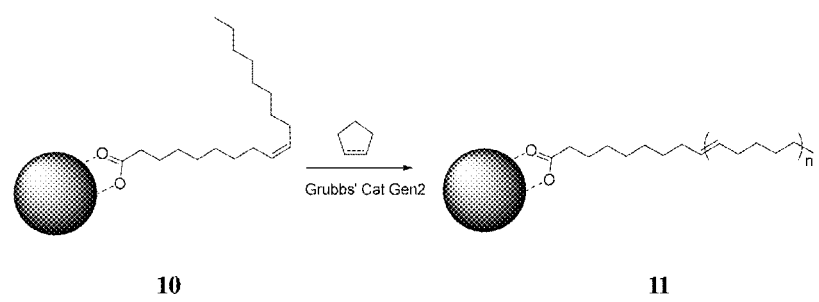
FIG. 10 is a schematic diagram of a chemical reaction in step (1) according to Example 7 of the present disclosure.

The specific steps are:

1 mL of the 10 mg/mL solution of intermediate 10 in toluene is diluted to 10 mL with toluene, and 6.8 mg cyclopentene is added. By purging with nitrogen for 20 minutes, oxygen gas is removed from the solvent. Then 8.5 mg of the second generation Grubbs catalyst (Grubbs' Cat Gen2) is added for the ROMP active polymerization shown in FIG. 10 while being stirred at room temperature for 2 hours. After the reaction system is concentrated, the quantum dot complex is precipitated by adding methanol. The quantum dot complex has a polymeric chain ligand with a specified polymeric chain length (with a molecular weight of about 830).

(2) The quantum dot complex is dissolved in toluene to produce a quantum dot ink, the concentration of the quantum dot complex is about 1 wt %. The viscosity of the quantum dot ink is measured to be 14 cps and the surface tension of the quantum dot ink is 30.4 dyn/cm (20° C.).

EXAMPLE 8

Manufacturing a Crosslinkable Quantum Dot Ink

In this example, a crosslinkable quantum dot ink can be manufactured by adding 0.01% benzoyl peroxide to the ink of the quantum dot complex synthesized in Example 7. Storage at a low temperature can prevent the crosslinkable quantum dot ink from being crosslinked of before inkjet printing to impair the inkjet printing effect.

EXAMPLE 9

Manufacturing a Quantum Dot Light Emitting Diode

In the example, a quantum dot light emitting diode is manufactured by using the quantum dot ink of Example 5. The specific steps are as follows.

(1) On the backplane of a defined pixel, a PEDOT: PSS is printed using Dimatix desktop inkjet printer on the pixel point and then dried at a temperature of 140° C.

(2) On the PEDOT: PSS, a layer of PVK is printed, and then dried at a temperature of 130° C.

(3) On the PVK film layer, the quantum dot ink obtained from Example 3 is printed, and then dried at a temperature of 120° C. During the drying the quantum dots are crosslinked.

(4) On the quantum dot film layer, ZnO nanoparticles are printed and then dried at a temperature of 80° C.

(5) The backplane is placed into a vacuum evaporation chamber, and an aluminum electrode having a 100 nm thickness is evaporated.

As can be seen from Examples 1 to 9, the surface of the quantum dot in the quantum dot complex in Examples of the present disclosure is bonded to a plurality of polymeric chain ligands by coordination, and the length of the polymeric chain is accurately controllable, so that the viscosity and surface tension of the ink containing the quantum dot complex can be effectively controlled. Moreover, additives can be avoided, and a low boiling point solvent can also be used to ensure the purity of the quantum dots in the ink. Furthermore, the manufacturing method is simple to operate.

It should be understood that the terms "first" and "second" in the description of the present disclosure are used only for describing technical features, but not to be understood as indicating or implying the relative importance or number of the described technical features. Therefore, a feature limited by "first" and "second" can indicate or imply inclusion of at least one feature. In the description of the present disclosure, the term "a plurality of" means at least two, for example, two, three, etc. unless there is a specific definition.

In the description of the present application, the statement with reference to the terms "one embodiment", "some embodiments", "examples", "specific examples", or "some examples" means that specific features, structures, materials, or characteristics described in combination with the embodiment or example are included in at least one of embodiments or examples of the present disclosure. In the description of the present application, the expression of the above terms is not necessary to be directed to the same embodiment or example. Moreover, the specific features, structures, materials, or characteristics described may be combined in a suitable way in one or more embodiments or examples. In addition, unless there is conflicting circumstance, those skilled in the art may combine different embodiments or examples described in the description of the present application, or combine the features of different embodiments or examples.

Although the embodiments of the present disclosure have been shown and described above, it is understood that the above embodiments are exemplary and not limitative to the scope of the disclosure, and those skilled in the art may change and modify the above embodiments in the scope of the present disclosure.

The application claims priority of Chinese Patent Application No. 201710175606.2 filed on Mar. 22, 2017, the disclosure of which is incorporated herein by reference in its entirety as part of the present application.

What is claimed is:

1. A quantum dot complex for inkjet printing, comprising:
a quantum dot; and
polymeric chain ligands, Wherein each of the polymeric chain ligands comprises a coordination unit and at least one polymeric chain, and the coordination unit connects the quantum dot with the polymeric chain;
wherein the polymeric chain has a molecular weight distribution of not more than about 1.3;
the coordination unit comprises at least one of a coordination element and a coordination group;
the coordination element, if present, comprises at least one of nitrogen, phosphorus, oxygen and sulfur;
the coordination group, if present, comprises at least one of carboxyl group, hydroxyl group and amine group; and
the polymeric chain comprises at least one of PS, polycyclopentene, polycarbazole and polypurine.

2. The quantum dot complex according to claim 1, wherein the polymeric chain comprises an unsaturated group, and the unsaturated group comprises an alkenyl group.

3. The quantum dot complex according to claim 1, wherein the coordination unit further comprises: at least one branch chain, which is a carbon chain having 5 to 10 carbon atoms and is connected with the at least one of the coordination element and the coordination group.

4. A method for manufacturing the quantum dot complex according to claim 1, comprising:
providing the quantum dot; and
bonding the polymeric chain ligand to the quantum dot by coordination, wherein the polymeric chain in the polymeric chain ligand is connected with the quantum dot via the coordination unit.

5. The method according to claim 4, wherein the bonding the polymeric chain ligand to the quantum dot by coordination is realized by the following steps:
producing the quantum dot connected to the coordination unit, wherein the coordination unit is bonded to the quantum dot by coordination; and
forming the polymeric chain by an active polymerization, wherein the polymeric chain is connected with the quantum dot via the coordination unit to obtain the polymeric chain ligand.

6. The method according to claim 5, wherein the polymeric chain comprises an alkenyl group, and the method further comprises:
adding a crosslinking agent after forming the polymeric chain to facilitate crosslinking reaction of alkenyls in the polymeric chain ligand.

7. The method according to claim 4, wherein the active polymerization is performed at a temperature not more than about 100 in a solvent comprising at least one of toluene and tetrahydrofuran.

8. A method for manufacturing the quantum dot complex according to claim 1, comprising:
providing a first mother liquid, which comprises a first element, an organic ligand and a first solvent;
providing a second mother liquid, which comprises a second element, the organic ligand and a second solvent;
adding the first mother liquid to the second mother liquid in an inert atmosphere to form a mixture, stirring and heating at a temperature of about 200 to 350° C., and then cooling down the mixture after reacting for about 30 seconds to 1 hour;
separating a precipitate from the cooled mixture by centrifugation and then drying the centrifuged precipitate to obtain the quantum dot connected with the coordination unit; and
mixing the quantum dot connected with the coordination unit with an initiator and a monomer for forming through an active polymerization the polymeric chain which is connected with the coordination unit to form the quantum dot complex;
wherein the first element and the second element are used to form the quantum dot;
each of the first solvent and the second solvent independently comprises at least one of octadecene, trioctylphosphin and trioctyloxyphosphin;
the active polymerization reaction is performed at a temperature of about 90 to 100° C., and the active polymerization reaction comprises Atom Transfer Radical Polymerization (ATRP), Reversible Addition-Fragmentation Chain Transfer (RAFT), Nitroxide-Mediated Free Radical Polymerization (NMP), or Ring-Opening Metathesis Polymerization (ROMP).

9. A quantum dot ink, comprising
the quantum dot complex according to claim 1, and
a low boiling point solvent.

10. A quantum dot light emitting diode device, comprising:
a quantum dot light-emitting layer made by printing and crosslinking the quantum dot ink according to claim 9.

* * * * *